United States Patent
Garbarino et al.

(10) Patent No.: US 9,455,668 B1
(45) Date of Patent: Sep. 27, 2016

(54) CAPACITANCE TO VOLTAGE CONVERTER WITH A LEAKAGE COMPENSATION LOOP

(71) Applicant: STMICROELECTRONICS S.R.L., Agrate Brianza (IT)

(72) Inventors: Marco Garbarino, Bareggio (IT); Andrea Donadel, Meda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/947,908

(22) Filed: Nov. 20, 2015

(51) Int. Cl.
H03F 3/52 (2006.01)
H03F 1/02 (2006.01)
H03F 3/45 (2006.01)

(52) U.S. Cl.
CPC ........ H03F 1/0205 (2013.01); H03F 3/45076 (2013.01); *H03F 2203/45116* (2013.01); *H03F 2203/45332* (2013.01)

(58) Field of Classification Search
CPC ........................................................ H03F 3/52
USPC ......................................... 330/109, 85, 260
See application file for complete search history.

(56) References Cited

U.S. PATENT DOCUMENTS

| | | | | |
|---|---|---|---|---|
| 5,334,952 A * | 8/1994 | Maddy | ..................... | H03L 7/199 331/1 A |
| 5,990,751 A * | 11/1999 | Takita | .................... | H03F 1/0222 330/10 |
| 2003/0174023 A1* | 9/2003 | Miyasita | ............. | H03F 3/45085 330/254 |
| 2008/0030184 A1* | 2/2008 | Okahara | ................. | H02P 9/305 323/286 |
| 2008/0106330 A1* | 5/2008 | Yoshida | .................. | H03F 3/387 330/10 |
| 2014/0065979 A1 | 3/2014 | Terry | | |
| 2016/0091525 A1* | 3/2016 | Oshima | ................. | G01P 15/125 73/514.32 |

* cited by examiner

*Primary Examiner* — Patricia T Nguyen
(74) *Attorney, Agent, or Firm* — Seed IP Law Group PLLC

(57) ABSTRACT

A method and apparatus for compensating current leakage is disclosed. In the method and apparatus, a differential amplifier receives a first input signal and a second input signal and outputs a first output signal and a second output signal. The first output signal is filtered to obtain a first filtered signal. The first filtered signal is compared to the first input signal and a first compensation signal is outputted having a first voltage that is a function of a difference between a voltage of the first filtered signal and a voltage of the first input signal. Current leakage in the first input signal is compensated for using the first compensation signal.

20 Claims, 10 Drawing Sheets

CAPACITANCE TO VOLTAGE CONVERTER WITH A LEAKAGE COMPENSATION LOOP

BACKGROUND

1. Technical Field

The present disclosure relates to a capacitance to voltage converter and, in particular, to a capacitance to voltage converter having a loop for compensating common or differential mode input leakage current.

2. Description of the Related Art

Leakage currents often occur at the interconnections between integrated circuits. For example, if two circuits are implemented on different semiconductor dies, leakage currents often occur at the interconnections between the dies. The leakages cause drainage of current from various signals. As a result of the drainage, current leakages degrade signals, performance and operation of the integrated circuits.

For example, in conventional capacitance to voltage amplifiers, leakage currents have been observed to degrade the performance of the conventional capacitance to voltage amplifiers. Further, depending on the severity of the current leakage, a conventional capacitance to voltage amplifier may be shut down or altogether become inoperable. In differential circuits, every pair of currents can be modeled with a pair of differential currents (with the same value and different signs) plus two common mode currents (with same value and sign), as shown in Equation (1):

$i1=i1, i2=i2$ $icm=(i1+i2)/2, id=(i1-i2)$ $i1=icm+id/2, i2=icm-id/2$

For simplicity, the document will refer separately to common mode leakage current and differential mode leakage current, without loss of generality.

BRIEF SUMMARY

A device may be summarized as including a differential amplifier having a first input terminal, a second input terminal, a first output terminal and a second output terminal; a first capacitor coupled between the first input terminal and the first output terminal; a first actuation resistor; a second actuation resistor; a first low-pass filter coupled to the first output terminal; a first operational amplifier having an inverting input coupled to the first input terminal, a non-inverting input coupled to an output of the first low-pass filter and an output coupled to the first input terminal via the first actuation resistor; a second capacitor coupled between the second input terminal and the second output terminal; a second low-pass filter coupled to the second output terminal; and a second operational amplifier having an inverting input coupled to the second input terminal, a non-inverting input coupled to an output of the second low-pass filter and an output coupled to the second input terminal via the second actuation resistor. The first operational amplifier may be configured to output a first voltage signal to compensate for a first current leakage at the first input terminal and the second operational amplifier may be configured to output a second voltage signal to compensate for a second current leakage at the second input terminal. The differential amplifier may be configured to receive a first input signal at the first input terminal and a second input signal at the second input terminal and output a first output signal at the first output terminal and a second output signal at the second output terminal. The first input signal and the second input signal may be differential signals with respect to each other. The first low-pass filter may be configured to receive the first output signal and output a first filtered signal that is a direct current (DC) component of the first output signal. The first operational amplifier may be configured to receive the first input signal at the inverting input and the first filtered signal at the non-inverting input and output a first compensation signal that compensates for a first current leakage in the first input signal. The second low-pass filter may be configured to receive the second output signal and output a second filtered signal that is a direct current (DC) component of the second output signal. The second operational amplifier may be configured to receive the second input signal at the inverting input and the second filtered signal at the non-inverting input and output a second compensation signal that compensates for a second current leakage in the second input signal.

A device may be summarized as including a voltage supply; a capacitance to voltage amplifier including: a differential amplifier having a first input terminal, a second input terminal, a first output terminal and a second output terminal; a first capacitor coupled between the first input terminal and the first output terminal; a first low-pass filter coupled to the first output terminal; a first resistor and a second resistor; a first operational amplifier having an inverting input coupled to the first input terminal, a non-inverting input coupled to an output of the first low-pass filter and an output coupled to the first input terminal via the first resistor; a second capacitor coupled between the second input terminal and the second output terminal; a second low-pass filter coupled to the second output terminal; and a second operational amplifier having an inverting input coupled to the second input terminal, a non-inverting input coupled to an output of the second low-pass filter and an output coupled to the second input terminal via the second resistor; and a variable capacitance stage including: a first variable capacitor coupled between the voltage supply and the first input terminal; and a second variable capacitor coupled between the voltage supply and the second input terminal. The first variable capacitor may vary according to $$C_0 + \frac{\Omega \cdot \sin(\omega_d)}{2}$$

and the second variable capacitor may vary according to $$C_0 - \frac{\Omega \cdot \sin(\omega_d)}{2},$$

where $C_0$ is a constant capacitor, $\Omega$ is an angular velocity associated with the first variable capacitor and the second variable capacitor and $\omega_d$ is a drive oscillation frequency. The first operational amplifier may be configured to output a first voltage signal to compensate for a first current leakage at the first input terminal and the second operational amplifier may be configured to output a second voltage signal to compensate for a second current leakage at the second input terminal. The differential amplifier may be configured to receive a first input signal at the first input terminal and a second input signal at the second input terminal and output a first output signal at the first output terminal and a second output signal at the second output terminal. A difference between a voltage of the second output signal and a voltage of the first output signal may be proportional to a difference between a voltage of the first input signal and a voltage of the second input signal. The first low-pass filter may be configured to receive the first output signal and output a first filtered signal that is a direct current (DC) component of the first output signal. The first operational amplifier may be configured to receive the first input signal at the inverting input and the first filtered signal at the non-inverting input and output a first compensation signal that compensates for a first current leakage in the first input signal. The second low-pass filter may be configured to receive the second output signal and output a second filtered signal that may be a direct current (DC) component of the second output signal. The second operational amplifier may be configured to receive the second input signal at the inverting input and the second filtered signal at the non-inverting input and output a second compensation signal that compensates for a second current leakage affecting the second input signal.

A method may be summarized as including receiving, by a differential amplifier, a first input signal and a second input signal; outputting, by the differential amplifier, a first output signal and a second output signal; filtering the first output signal to obtain a first filtered signal; comparing the first filtered signal to the first input signal; outputting a first compensation signal having a first voltage that is a function of a difference between a voltage of the first filtered signal and a voltage of the first input signal; and compensating current leakage in the first input signal using the first compensation signal.

The method may further include filtering the second output signal to obtain a second filtered signal; comparing the second filtered signal to the second input signal; outputting a second compensation signal having a second voltage that is a function of a difference between a voltage of the second filtered signal and a voltage of the second input signal; and compensating current leakage in the second input signal using the second compensation signal. The first filtered signal may be a DC component of the first output signal.

DETAILED DESCRIPTION

In many electronic devices, such as gyroscopes, time-variant capacitive signals are produced by a sensing element. The time variant capacitive signals may be a pair of differential signals that vary based on the variation in some capacitors. A capacitance to voltage converter (or amplifier) may be used to convert the capacitive signals to voltage signals.

Figure 1:
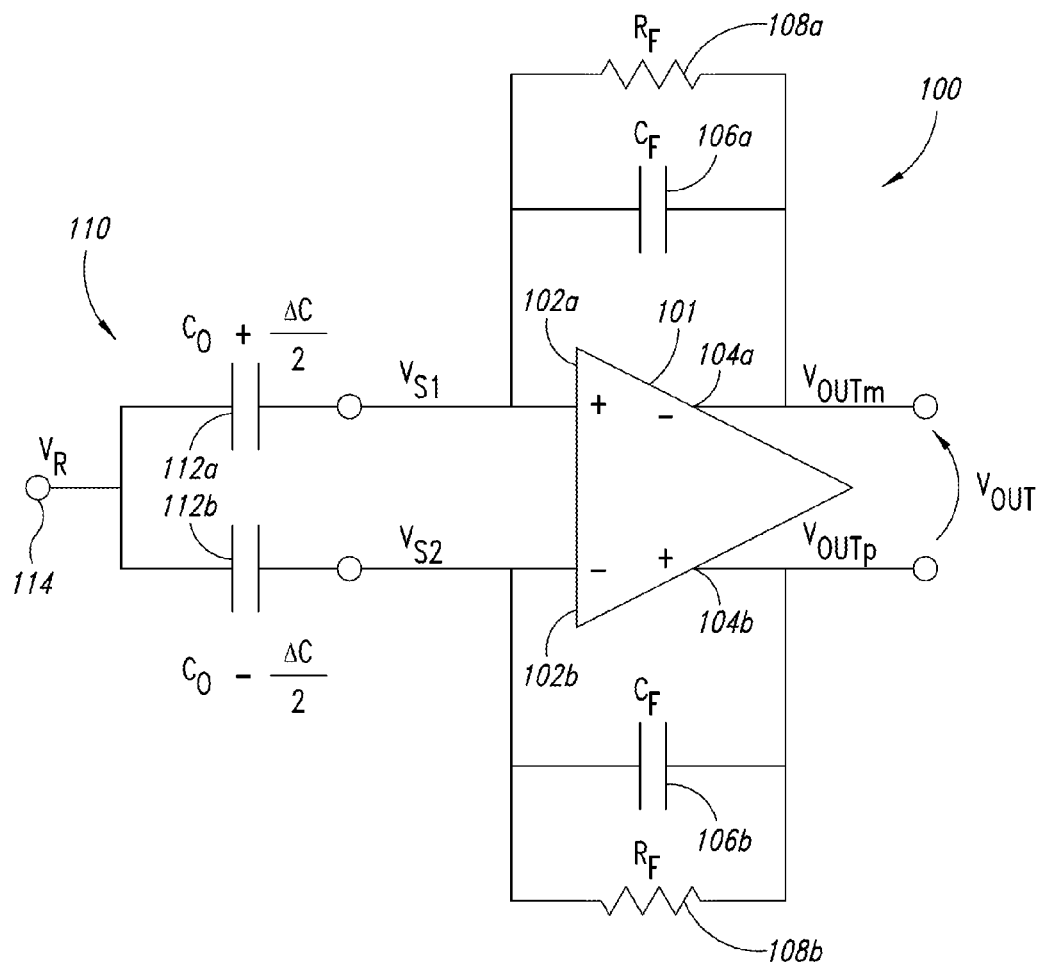
FIG. 1 is a schematic of a capacitance to voltage amplifier.

FIG. 1 is a schematic of a capacitance to voltage amplifier 100. The capacitance to voltage amplifier 100 comprises a differential amplifier 101, which may be a fully-differential operational amplifier. The differential amplifier 101 has a first input terminal 102a, a second input terminal 102b, a first output terminal 104a and a second output terminal 104b. As shown in FIG. 1, the first input terminal 102a is a non-inverting input terminal, the second input terminal 102b is an inverting input terminal, the first output terminal 104a is an inverting output terminal and the second output terminal 104b is non-inverting output terminal.

The capacitance to voltage amplifier 100 also comprises a first capacitor 106a, a second capacitor 106b, a first resistor 108a and a second resistor 108b. The first capacitor 106a is electrically coupled between the first input terminal 102a and the first output terminal 104a. The first resistor 108a is also electrically coupled between the first input terminal 102a and the first output terminal 104a in parallel with the first capacitor 106a.

Similarly, the second capacitor 106b is electrically coupled between the second input terminal 102b and the second output terminal 104b. The second resistor 108b is also electrically coupled between the second input terminal 102b and the second output terminal 104b in parallel with the second capacitance 106b.

The capacitance to voltage amplifier 100 is electrically coupled to a variable capacitance stage 110, which represents the model of the sensing element. In particular, the variable capacitance stage 110 includes a first variable capacitance 112a (denoted as $C_{s1}$) and a second variable capacitance 112b (denoted as $C_{s2}$). The first variable capacitance 112a is electrically coupled between a voltage bias node 114 and the first input terminal 102a of the differential amplifier 101. Further, the second variable capacitance 112b is electrically coupled between the voltage bias node 114 and the second input terminal 102b of the differential amplifier 101.

The first variable capacitance 112a may vary according to:

$$C_{S1} = C_0 + \frac{\Omega \cdot \sin(\omega_d)}{2} \qquad \text{Equation (1)}$$

where $C_0$ is a constant capacitance, $\Omega$ is an angular velocity (for example, of a gyroscope driving the stage 110), $\omega_d$ is a modulating frequency (for example, the driving frequency of the gyroscope) and sin is the sine operator. The second variable capacitance 112b may vary in a differential mode with respect to the first variable capacitance 112a and may, thus, be represented by:

$$C_{S2} = C_0 - \frac{\Omega \cdot \sin(\omega_d)}{2}. \qquad \text{Equation (2)}$$

Supplying a voltage $v_R$ at bias node 114 results in a charge movement, and thus in two currents flowing (denoted as $i_{s1}$ and $i_{s2}$) into the input nodes (denoted as $v_{s1}$ and $v_{s2}$). The first input current signal and the second input current signal vary based on the first variable capacitance 112a and the second variable capacitance 112b, respectively, according to equations below:

$$i_{S1} = \frac{d}{dt}((V_{S1} - V_R) * C_{S1}), \; i_2 = \frac{d}{dt}((V_{S2} - R_r) * C_{S2})$$

The differential feedback loop composed of the parallel arrangement of the first resistor 108a and the first capacitor 106a between the first input terminal 102a and the first output terminal 104a and the parallel arrangement of the second resistor 108b and the second capacitor 106b between the second input terminal 102b and the second output terminal 104b, together with the differential amplifier 101 makes the input nodes "virtual grounds" and thus forces the input current to flow through the feedback elements. This causes the variation of the first output signal (denoted as $v_{OUTm}$) at the first output terminal 104a and the second output signal (denoted as $v_{OUTp}$) at the second output terminal 104b. The first output signal is a differential signal with respect to the second output signal and vice-versa.

The current to voltage amplifier 100 has the following closed loop transfer function:

$$v_{out}(s) = \Delta C(s) \cdot (v_r - v_s) \cdot \frac{sR_F}{(1 + sR_F C_F)} \quad \text{Equation (3)}$$

where $R_F$ is the resistance of the first resistor 108a and the second resistor 108b and $C_F$ is the capacitance of the first capacitor 106a and the second capacitor 106b.

The capacitance of the first capacitor 106a and the second capacitor 106b is chosen in order to reach the target gain of the capacitance to voltage amplifier.

The resistance of the first resistor 108a and the second resistor 108b is chosen such that the transfer function has a pole that is lower than a band surrounding a frequency of interest. If the pole is selected to be at 200 Hertz (Hz), the transfer function dictates that the resistance of the first resistor 108a and the second resistor 108b is 1.6 giga Ohms (GO) given that $C_F$=500 femto farad (fF).

The relatively large resistance of the first resistor 108a and the second resistor 108b makes the current to voltage amplifier sensitive to leakage current. However, the relatively large resistance value cannot be decreased without degrading circuit performances.

Further, the relatively large resistance is difficult to implement under certain size constraints. The relatively large resistance is typically replaced with a pseudo-resistor topology comprising two transistors to conserve silicon die space. However, pseudo-resistors do not have a linear response like conventional resistors. The non-linear response of pseudo-resistors makes the performance of the capacitance to voltage amplifier more sensitive to the leakage currents.

Figure 2:
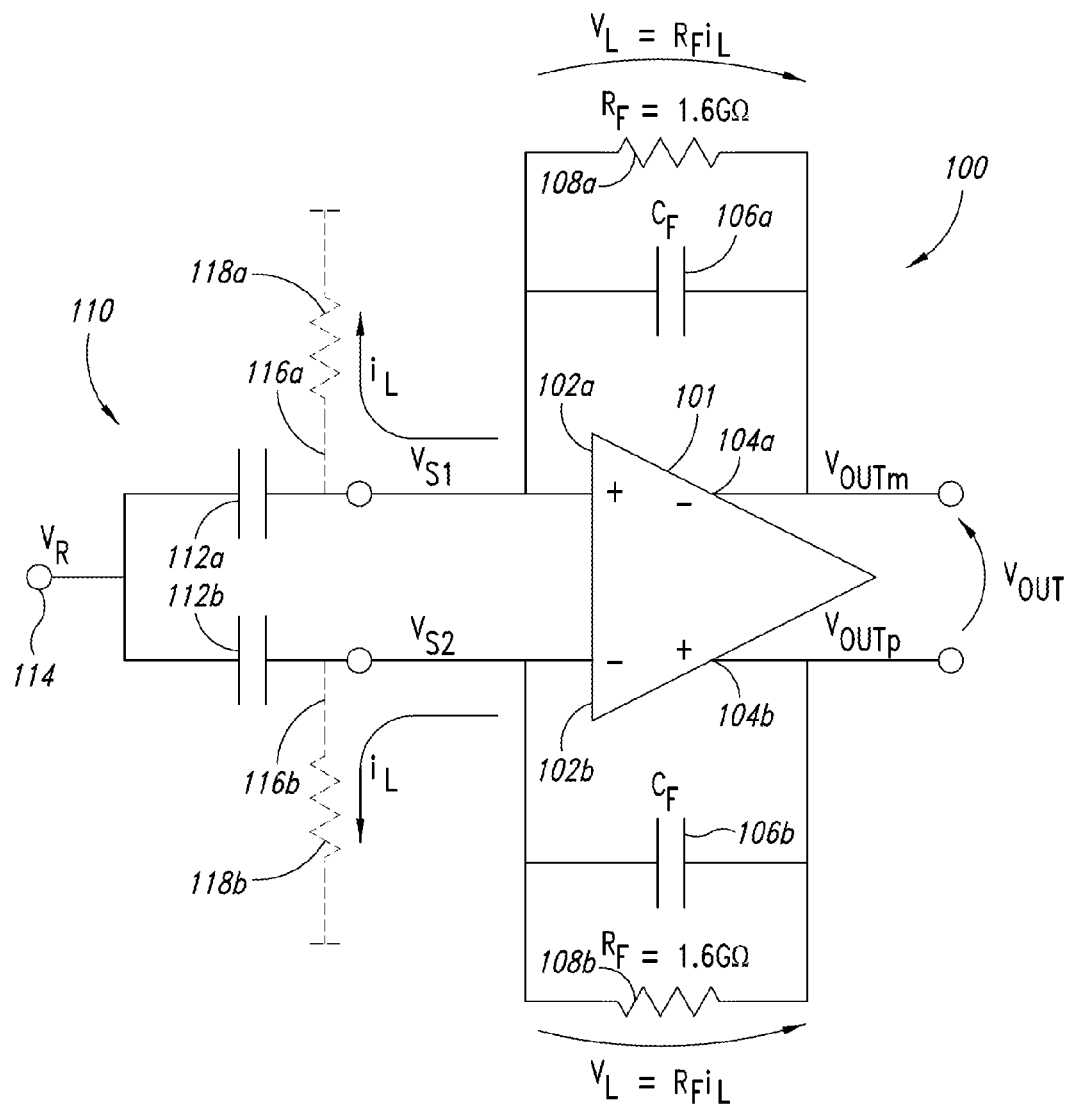
FIG. 2 is a schematic of the capacitance to voltage amplifier of FIG. 1 experiencing a common mode leakage.

FIG. 2 is a schematic of the capacitance to voltage amplifier 100 experiencing common mode leakage during operation. Similar elements of the capacitance to voltage amplifier 100 as those described with reference to FIG. 1 have the same reference numerals. The leakage is modelled in FIG. 2 by two paths 116a, 116b (shown in the dashed line in FIG. 2) that respectively leak current from the first input terminal 102a and the second input terminal 102b of the differential amplifier 101. For the purposes of modelling the current leakage, the first path 116a has a first leakage resistance 118a and the second path 116b has a second leakage resistance 118b.

Current leakage occurs in many circuits. For example, current leakage can occur when the capacitance to voltage amplifier 100 and the variable capacitance stage 110 are formed on different integrated circuits (separate semiconductor die) or are implemented on different printed circuit boards, i.e., physically separated and electrically coupled by wires or traces.

In the capacitance to voltage amplifier 100, a relatively small common mode leakage will be amplified as a result of a relatively large resistance of the first resistor 108a and the second resistor 108b. For example, if the common mode leakage is 100 pico Ampere (pA) or $10^{-10}$ A, a voltage drop across the first resistor 108a and the second resistor 108b due to the leakage will be $10^{-10} \cdot 1.6 \cdot 10^9 = 160$ milli Volt (mV), which is significant given a leakage of only 100 pA.

Considering the implementation of an output common mode feedback into the differential amplifier 101, the voltage drop will occur at the input nodes (102a and 102b), and the large value of this drop may change the operating point or the bias point of the input stage of the differential amplifier 101. Further, the voltage drop negatively impacts the amplifier's 100 sensitivity to changing input signals ($v_{s1}$ and $v_{s2}$). In addition, in some realization of the operational amplifier, the input stage of the operational amplifier 101 may be turned off altogether as a result of such a voltage drop.

Figure 3:
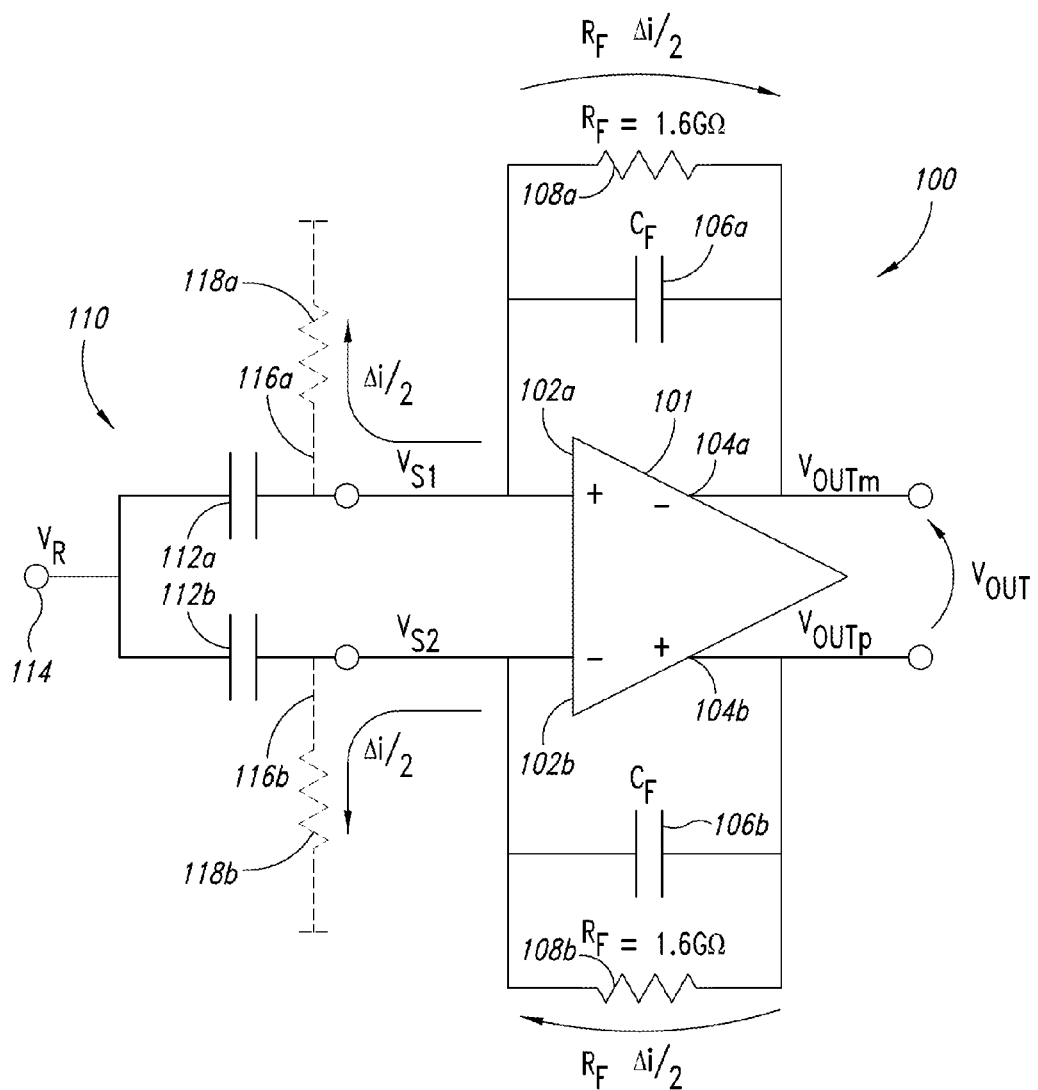
FIG. 3 is a schematic of the capacitance to voltage amplifier of FIG. 1 experiencing a differential mode leakage.

Similar to the common mode current leakage, an impact of differential mode current leakage is magnified due to having a large resistance for the first resistor 108a and the second resistor 108b. FIG. 3 is a schematic of the capacitance to voltage amplifier 100 experiencing a differential mode leakage during operation. When the differential mode current leakage is $\Delta i/2$, the voltage difference between the first output terminal 104a and the second output terminal 104b of the differential amplifier 101 is $R_f \Delta i$, where $R_f$ is the first resistor 108a or the second resistor 108b. Accordingly, when $\Delta i$ is as low as 10 pA, the output of the capacitance to voltage amplifier 100 varies by 16 mV. This deviation in voltage erodes the output dynamic range of the capacitance to voltage amplifier 100, further increasing the differential leakage current, the output voltage drift can also saturate the output stage of the capacitance to voltage amplifier.

Figure 4:
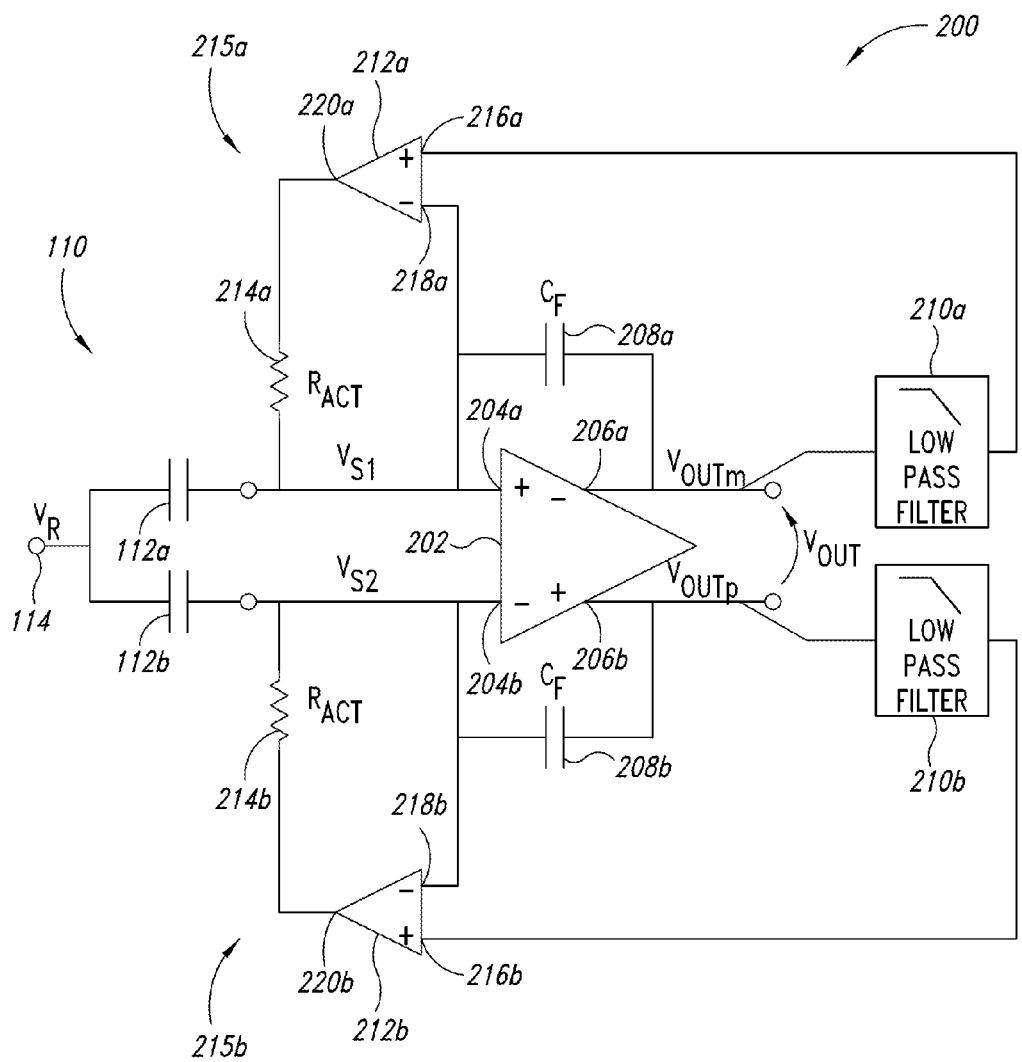
FIG. 4 is a schematic of a capacitance to voltage amplifier in accordance with an embodiment.

FIG. 4 is a schematic of a capacitance to voltage amplifier 200 in accordance with at least one embodiment. The capacitance to voltage amplifier 200 includes a differential amplifier 202, which may be a fully-differential operational amplifier. The differential amplifier 202 has a first input terminal 204a, a second input terminal 204b, a first output terminal 206a and a second output terminal 206b.

The capacitance to voltage amplifier 200 includes a first capacitor 208a, a second capacitor 208b, a first low pass filter 210a, a second low pass filter 210b, a first operational amplifier 212a, a second operational amplifier 212b, a first actuation resistor 214a and a second actuation resistor 214b.

The first capacitor 208a is electrically coupled between the first input terminal 204a and the first output terminal 206a. The first operational amplifier 212a has a first non-inverting terminal 216a, a first inverting terminal 218a and a first output terminal 220a.

The first non-inverting input terminal 216a is coupled to an output of the first low pass filter 210a, whereby the input of the first low pass filter 210a is coupled to the first output terminal 206a. The first inverting input terminal 218a, on the other hand, is coupled to the first input terminal 204a of the differential amplifier 202. The first actuation resistor 214a is coupled between the first output terminal 220a of the first operational amplifier 212a and the first input terminal 204a of the differential amplifier 202.

Similarly, the second capacitor 208b is electrically coupled between the second input terminal 204b and the second output terminal 206b. The second operational amplifier 212b has a second non-inverting terminal 216b, a second inverting terminal 218b and a second output terminal 220b. The second non-inverting input terminal 216b is coupled to an output of the second low pass filter 210b, whereby the input of the second low pass filter 210b is coupled to the second output terminal 206b. The second inverting input terminal 218b, on the other hand, is coupled to the second input terminal 204b of the differential amplifier 202. The second actuation resistor 214b is coupled between the second output terminal 220b of the second operational amplifier 212b and the second input terminal 204b of the differential amplifier 202.

The capacitance to voltage amplifier 200 is electrically coupled to the variable capacitance stage 110 as described herein. The first variable capacitance 112a of the variable capacitance stage 110 is electrically coupled between the voltage bias node 114 and the first input terminal 204a. Further, the second variable capacitance 112b is electrically coupled between the voltage bias node 114 and the second input terminal 204b.

The capacitance to voltage amplifier 200 includes two direct current (DC) feedback loops 215a, 215b that respectively replace the first resistor 108a and the second resistor 108b of the capacitance to voltage amplifier 100 described with reference to FIGS. 1-3.

Making reference to FIG. 4, the first low pass filter 210a receives a first output signal (denoted as $v_{OUTm}$) output by the first output terminal 206a. The first low pass filter 210a extracts a first DC component of the first output signal and outputs the first DC component. The first operational amplifier 212a receives the first DC component at the first non-inverting input terminal 216a. The first operational amplifier 212a also receives the first input signal of the differential amplifier 202 (denoted as $v_{s1}$) at its inverting input terminal 218a. The first operational amplifier 212a outputs an output voltage proportional to a difference between the voltage of the first DC component and the first input signal. The first actuation resistor 214a transforms the output voltage into a first current signal that passes through the first actuation resistor 214a. The first current signal compensates current leakage at the first input terminal 204a. If the first input signal changes due to current leakage, the first operational amplifier 212a detects the change and compensates for the change by adjusting its output voltage.

Similarly, the second feedback loop 215b made by arranging the second low pass filter 210b, the second operational amplifier 212b and the second actuation resistor 214b produces a second current signal that compensates current leakage at the second input terminal 204b. The second low pass filter 210b receives a second output signal (denoted as $v_{OUTp}$) output by the second output terminal 206b. The second low pass filter 210b extracts a second DC component of the second output signal and outputs the second DC component. The second operational amplifier 212b receives the second DC component at its second non-inverting input terminal 216b. The second operational amplifier 212b also receives the second input signal of the differential amplifier 202 (denoted as $v_{s2}$) at its inverting input terminal 218b. The second operational amplifier 212b, in turn, outputs an output voltage proportional to a difference between the voltage of the second DC component and the second input signal. The second actuation resistor 214b transforms the output voltage into a second current signal. Similar to the first current signal, the second current signal compensates current leakage at the second input terminal 204b of the differential amplifier 202.

Figure 5:
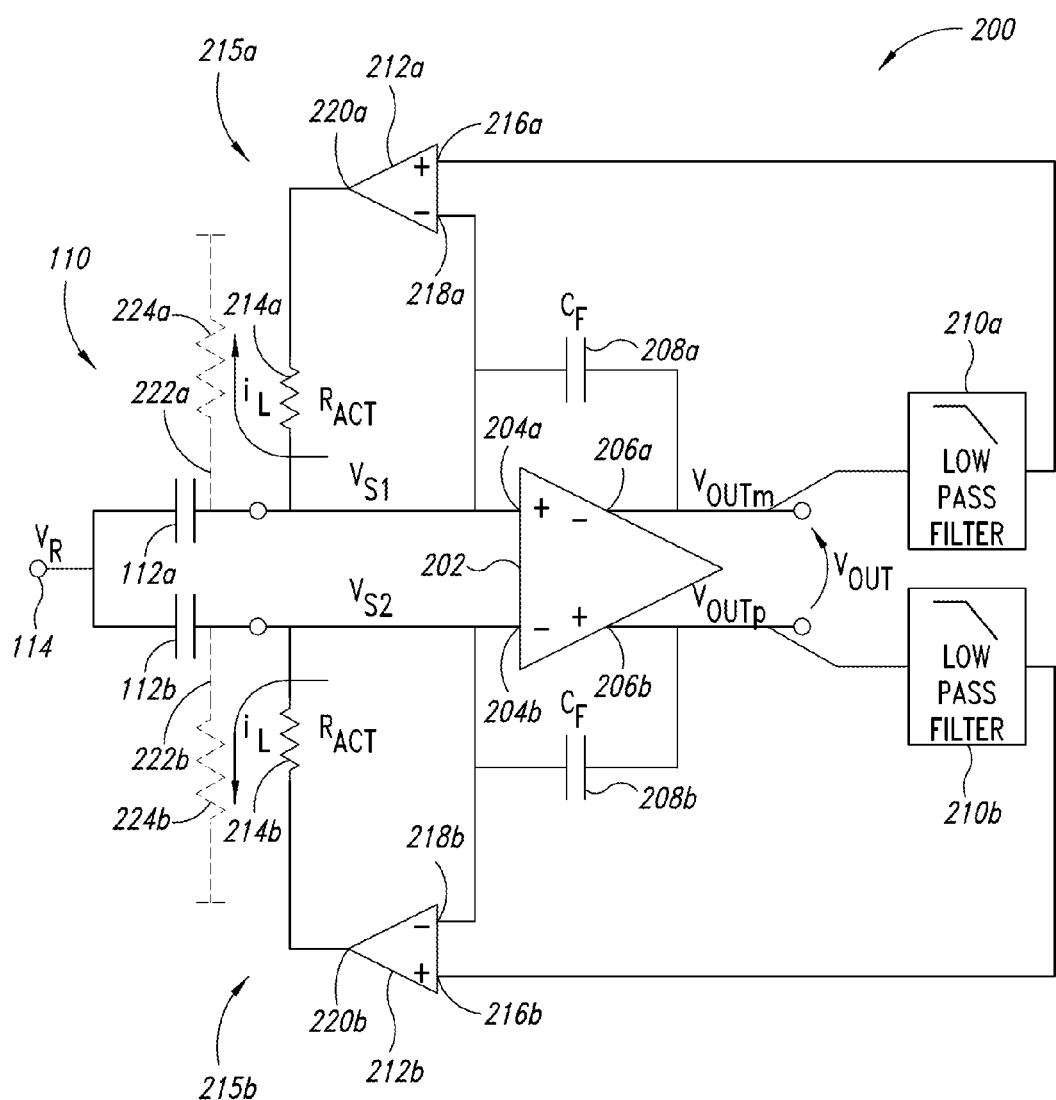
FIG. 5 is a schematic of the capacitance to voltage amplifier of FIG. 4 experiencing a common mode leakage.

FIG. 5 is a schematic of the capacitance to voltage amplifier 200 experiencing common mode leakage. The common mode leakage is modelled in FIG. 5 by two paths 222a, 222b (shown by the dashed line) that respectively leak current from the first input terminal 204a and the second input terminal 204b of the differential amplifier 200. For the purposes of modelling the current leakage, the first path 222a has a first leakage resistance 224a and the second path 222b has a second leakage resistance 224b.

In operation, the capacitance to voltage amplifier 200 experiences common mode current leakage. Under common mode current leakage, a first leakage current (denoted as $i_L$) flows out of the first input terminal 204a and through the first path 222a. Similarly, a first leakage current (also denoted as $i_L$) flows out of the second input terminal 204b and through the second path 222b.

Because of the presence of an output common mode feedback, the two outputs 206a, 206b of the differential amplifier 202, cannot experiment a common mode drift. Thus, the common mode leakage current shifts the input nodes 204a, 204b of the differential amplifier 202. The two differential amplifiers 212a, 212b sense the variation of nodes 204a, 204b through their inverting inputs 218a, 218b and they produce an output variation at their output nodes 215a, 215b.

The voltage variation of nodes 215a, 215b causes two currents to flow through the actuation resistors 214a, 214b. When the circuit reaches the steady state condition, the common mode leakage currents are entirely provided by operational amplifiers 212a, 212b through acting resistances 214a, 214b.

Figure 6:
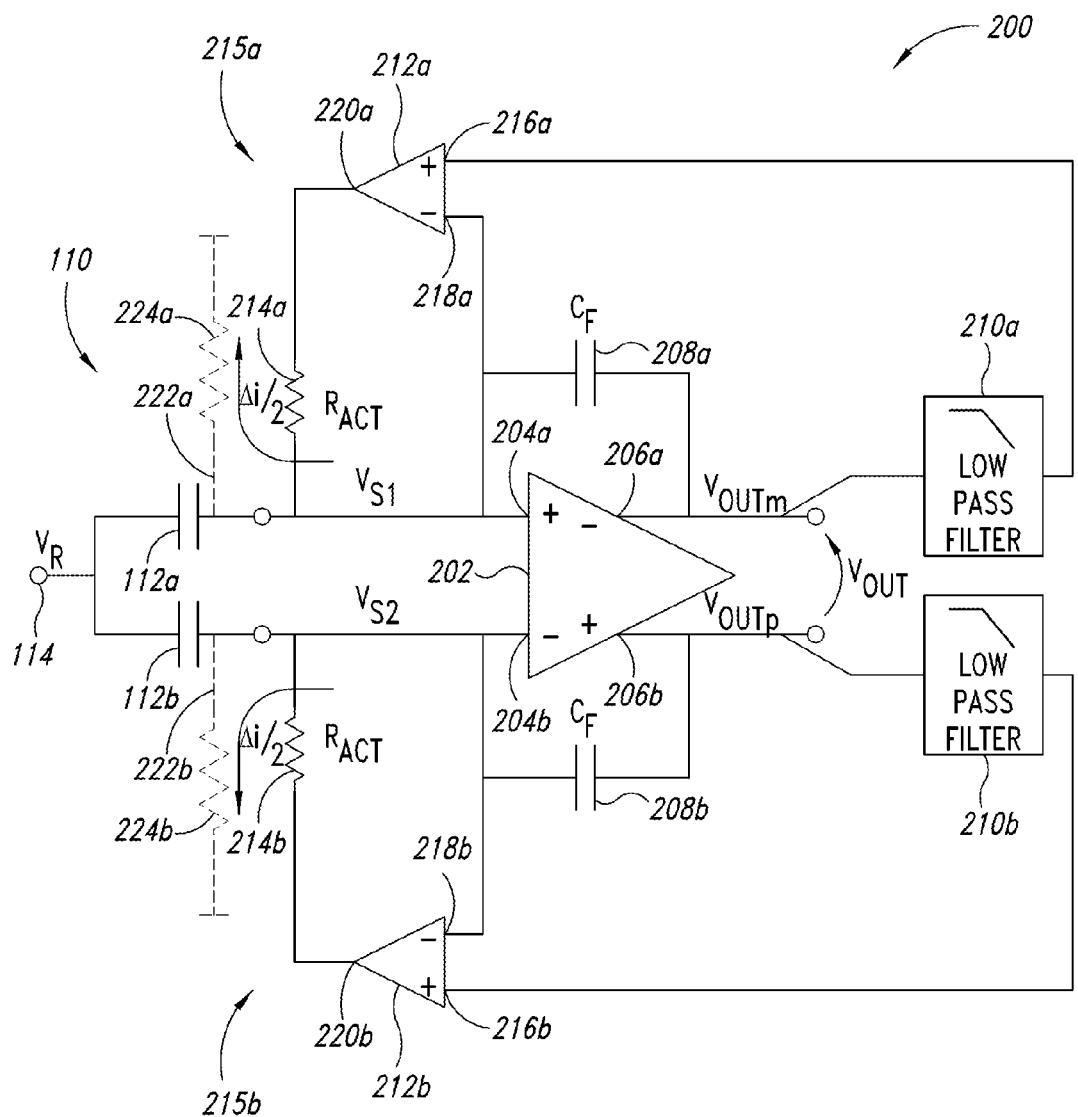
FIG. 6 is a schematic of the capacitance to voltage amplifier of FIG. 4 experiencing a differential mode leakage.

FIG. 6 is a schematic of the capacitance to voltage amplifier 200 experiencing differential mode leakage. Similar elements of the capacitance to voltage amplifier 200 of FIG. 6 as those described with reference to FIG. 5 have the same reference numerals. The capacitance to voltage amplifier 200 is under differential mode leakage. When a pair of differential leakage currents is injected at the input of the capacitance to voltage amplifier, it causes a differential voltage variation at the output 206a, 206b of the fully differential operation amplifier 202, because of the loop composed by the fully differential operational amplifier 202 and the feedback capacitance.

The voltage variation is reported at non-inverting inputs 216a, 216b of the operational amplifiers 212a, 212b through the low pass filters 210a, 210b. The operational amplifiers 212a, 212b sense their inputs' variation and react producing an output variation at their output nodes 215a, 215b. The voltage variation of nodes 215a, 215b causes two currents to flow through the actuation resistors 214a, 214b. When the circuit reaches the steady state condition, the differential mode leakage currents are entirely provided by operational amplifiers 212a, 212b through acting resistances 214a, 214b.

Figure 7A:
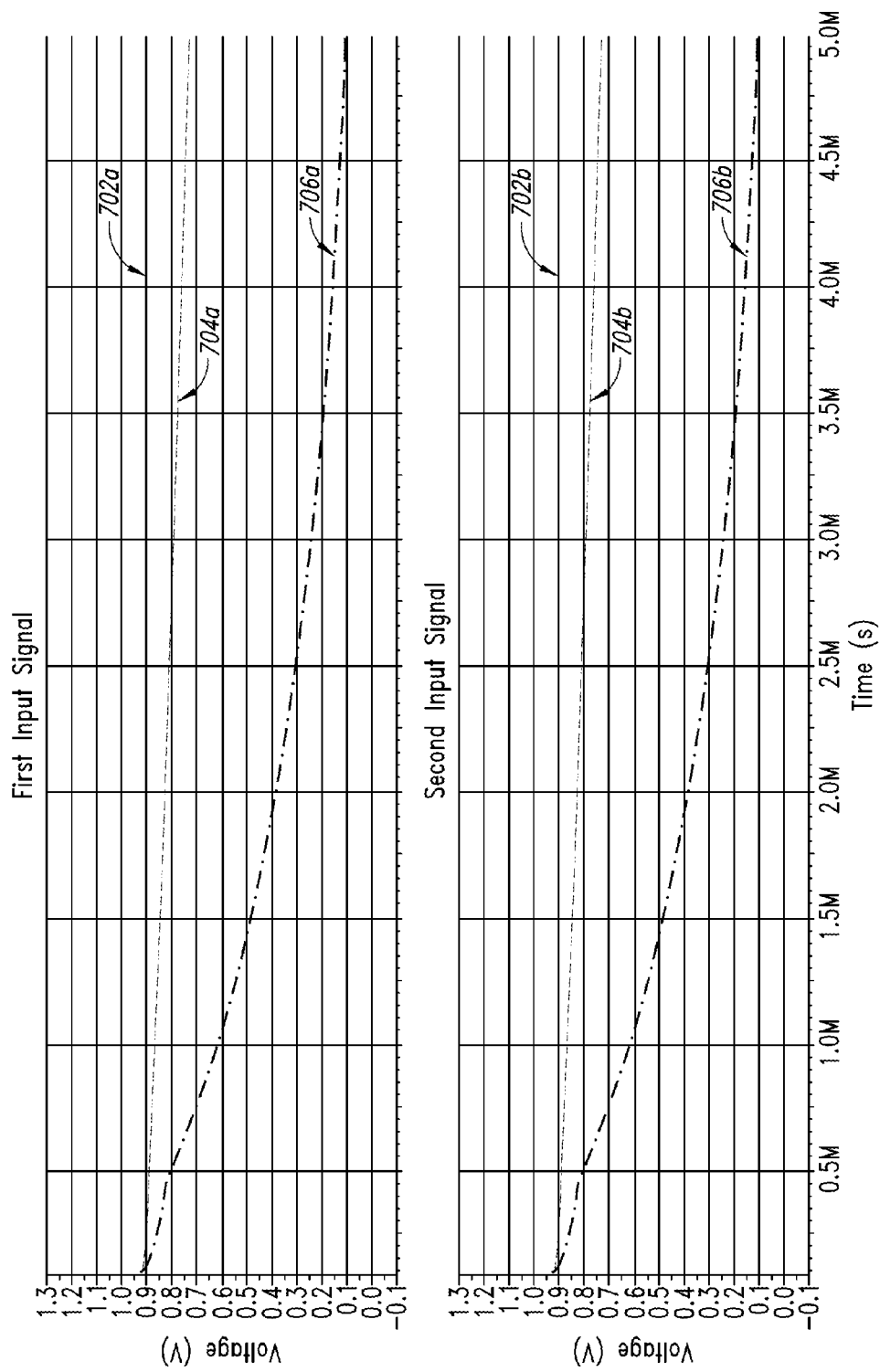
FIG. 7A is diagrams of first and second input signals of the capacitance to voltage amplifier described with reference to FIG. 1 experiencing a common mode leakage.

FIG. 7A is diagrams of the first and second input signals of the capacitance to voltage amplifier 100 described with reference to FIG. 1 under common mode leakage. When the leakage current is 0 A, the voltage levels of the first input signal and the second input signal (represented by lines 702a, 702b) is not affected as observed by lines 702a, 702b, which are flat. However, with a leakage current of 1 nano Amperes (nA), the voltages of the first input signal and the second input signal (represented by lines 706a, 706b) decrease significantly. Further, as time passes and the current continues to leak, the voltages of the first input signal and the second input signal continue decreasing. Similarly, when the leakage current is between 0 A and 1 nA, the voltages of the first input signal and the second input signal (represented by lines 704a, 704b) also decrease over time thereby degrading the first input bias value and the second input bias value.

Figure 7B:
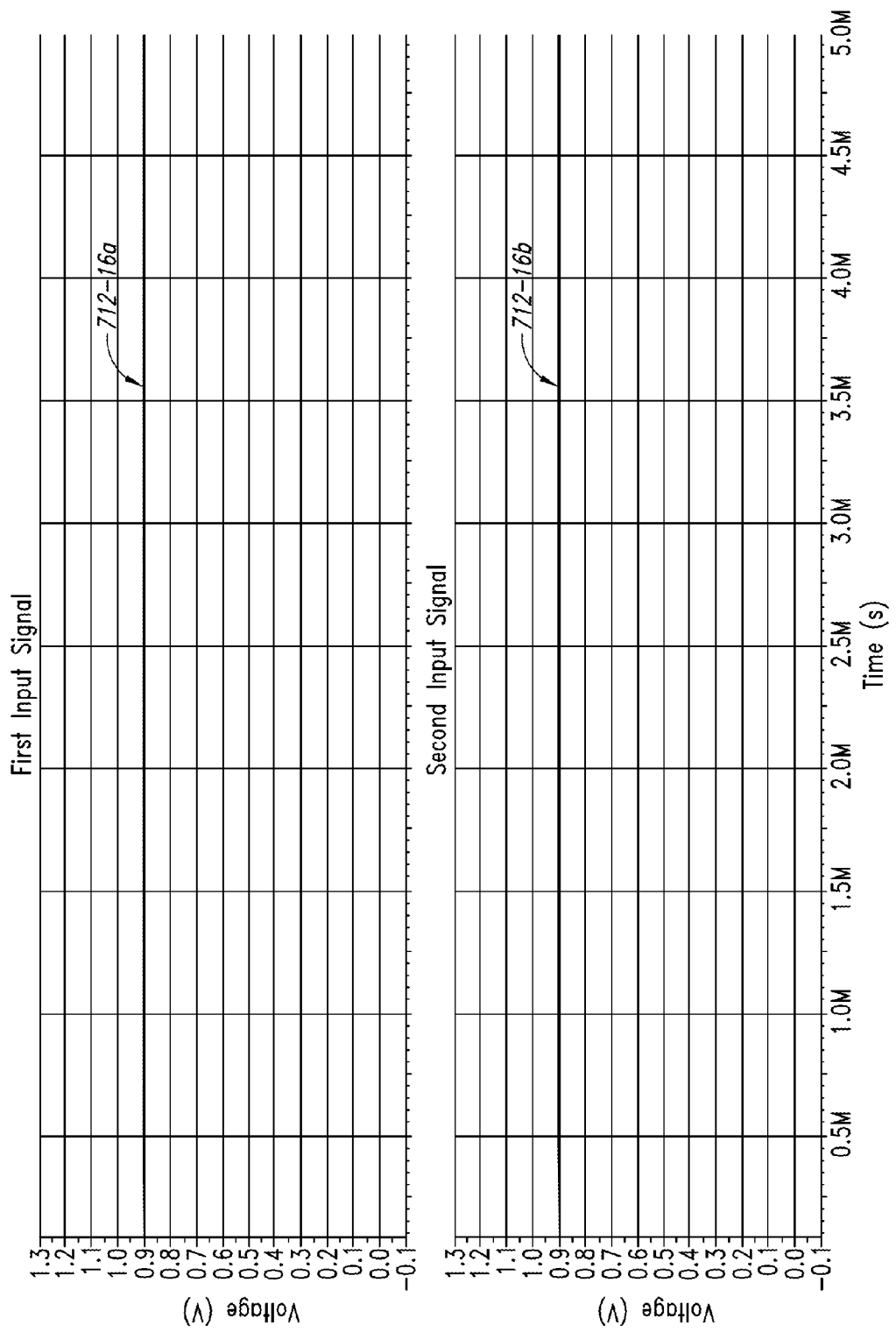
FIG. 7B is diagrams of first and second input signals of the capacitance to voltage amplifier described with reference to FIG. 4 experiencing a common mode leakage.

FIG. 7B is diagrams of the first and second input signals of the capacitance to voltage amplifier 200 described with reference to FIG. 4 under common mode leakage. As the leakage current is changed from 0 A, to a current between 0 A and 1 nA and then to a current of 1 nA, the voltage of the first input signal (represented by line 712a for a current level of 0 A, line 714a for a current level between 0 A and 1 nA and line 716a for a current level of 1 nA) is not affected. Similarly, the voltage of the second input signal (represented by line 712b for a leakage current of 0 A, line 714b for a leakage current between 0 A and 1 nA and line 716b for a leakage current of 1 nA) is also not affected. That is due to the fact that the leakage currents are compensated by the feedback loops 215a, 215b.

Figure 8A:
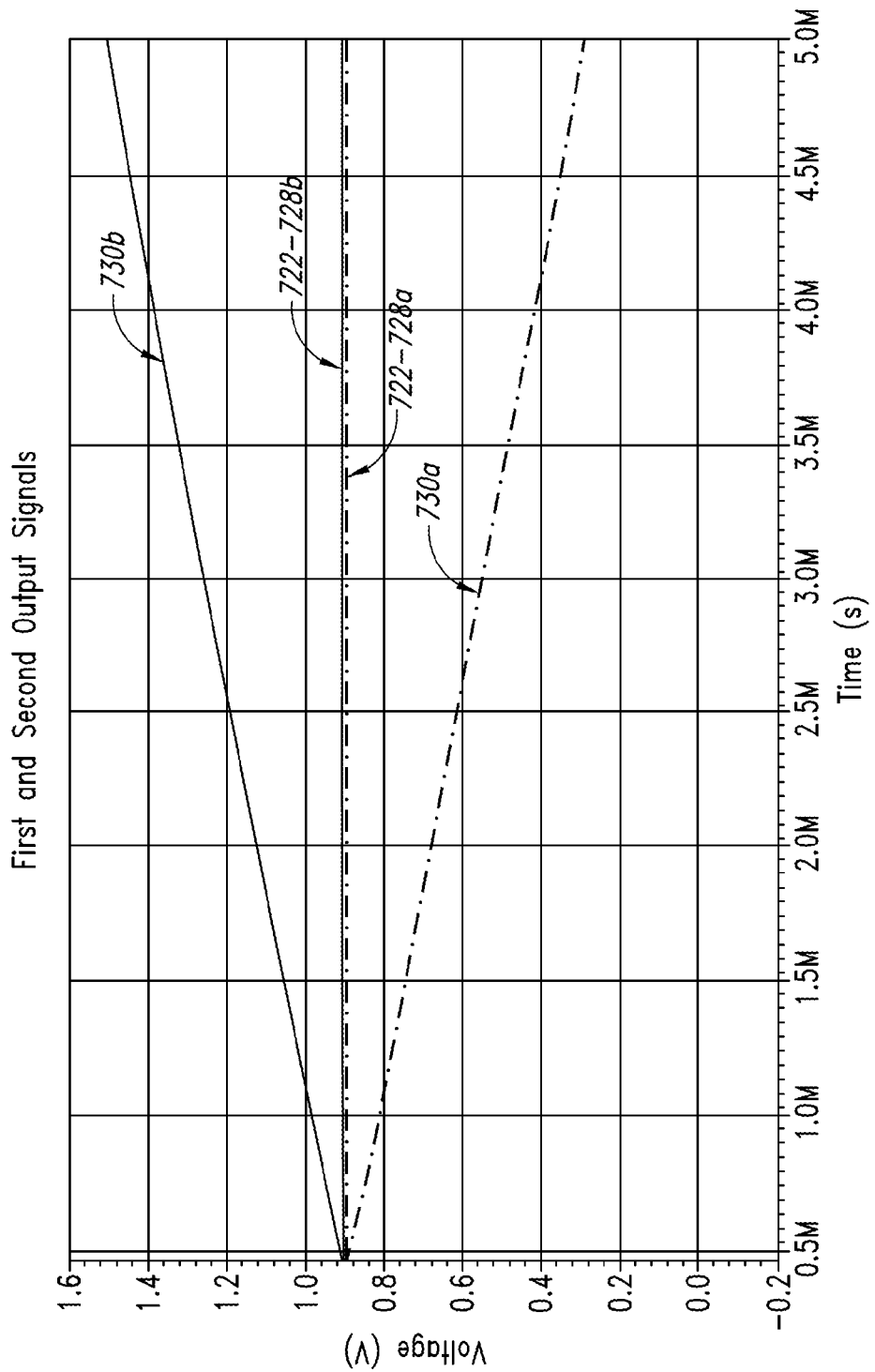
FIG. 8A is diagrams of the first and second output signals of the capacitance to voltage amplifier described with reference to FIG. 1 experiencing a differential mode leakage.

FIG. 8A is diagrams of the first and second output signals of the capacitance to voltage amplifier 100 described with reference to FIG. 1 under differential mode leakage. When the leakage current is 100 pico Ampere (pA), the voltages of the first output signal and the second output signal (represented by lines 730a, 730b) diverge from 0.9V. When the leakage current in differential mode is below 100 pA, the voltages of the first output signal and the second output signal (represented by four overlapping lines 722-728a, 728b) is not affected.

Figure 8B:
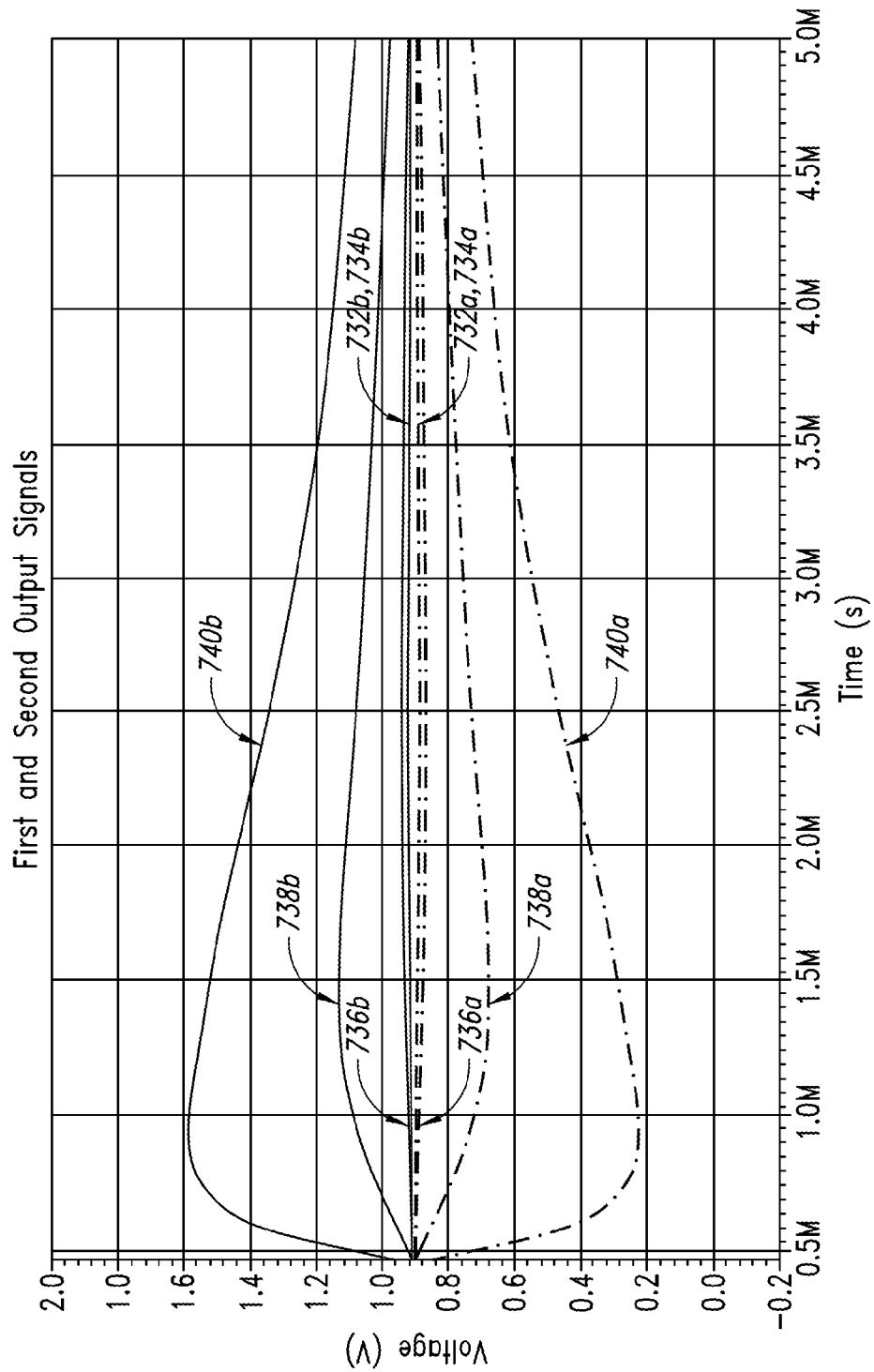
FIG. 8B is diagrams of the first and second output signals of the capacitance to voltage amplifier described with reference to FIG. 4 experiencing a differential mode leakage.

FIG. 8B is diagrams of the first and second output signals of the capacitance to voltage amplifier 200 described with reference to FIG. 4 under differential mode leakage. Lines 740a, 740b respectively represent the voltages of the first and second output signals of the capacitance to voltage amplifier 200 when the differential mode current leakage is 100 pA. As may be seen in FIG. 8B, the voltages initially diverge from a desired value of 0.9V. However, as the feedback loops 215a, 215b compensate for the leakage current, the voltage converges to 0.9V over time. Similarly, lines 732-738a, 738b show the voltages of the first and second output signals when the differential leakage current is varied from 0 A to a current below 100 pA. The feedback loops 215a, 215b compensate for the leakage current and over time the effect of the feedback loops 215a, 215b can be seen in FIG. 8B as the voltages of the first and second output signals converge over time to 0.9V.

The various embodiments described above can be combined to provide further embodiments. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
 a differential amplifier having a first input terminal, a second input terminal, a first output terminal and a second output terminal;
 a first capacitor coupled between the first input terminal and the first output terminal;
 a first actuation resistor;
 a second actuation resistor;
 a first low-pass filter coupled to the first output terminal;
 a first operational amplifier having an inverting input coupled to the first input terminal, a non-inverting input coupled to an output of the first low-pass filter and an output coupled to the first input terminal via the first actuation resistor;
 a second capacitor coupled between the second input terminal and the second output terminal;
 a second low-pass filter coupled to the second output terminal; and
 a second operational amplifier having an inverting input coupled to the second input terminal, a non-inverting input coupled to an output of the second low-pass filter and an output coupled to the second input terminal via the second actuation resistor.

2. The device of claim 1, wherein the first operational amplifier is configured to output a first voltage signal to compensate for a first current leakage at the first input terminal and the second operational amplifier is configured to output a second voltage signal to compensate for a second current leakage at the second input terminal.

3. The device of claim 1, wherein the differential amplifier is configured to receive a first input signal at the first input terminal and a second input signal at the second input terminal and output a first output signal at the first output terminal and a second output signal at the second output terminal.

4. The device of claim 3, wherein the first input signal and the second input signal are differential signals with respect to each other.

5. The device of claim 3, wherein the first low-pass filter is configured to receive the first output signal and output a first filtered signal that is a direct current (DC) component of the first output signal.

6. The device of claim 5, wherein the first operational amplifier is configured to receive the first input signal at the inverting input and the first filtered signal at the non-inverting input and output a first compensation signal that compensates for a first current leakage in the first input signal.

7. The device of claim 3, wherein the second low-pass filter is configured to receive the second output signal and output a second filtered signal that is a direct current (DC) component of the second output signal.

8. The device of claim 7, wherein the second operational amplifier is configured to receive the second input signal at the inverting input and the second filtered signal at the non-inverting input and output a second compensation signal that compensates for a second current leakage in the second input signal.

9. A device, comprising:
 a voltage supply;
 a capacitance to voltage amplifier including:
  a differential amplifier having a first input terminal, a second input terminal, a first output terminal and a second output terminal;
  a first capacitor coupled between the first input terminal and the first output terminal;

a first low-pass filter coupled to the first output terminal;

a first resistor and a second resistor;

a first operational amplifier having an inverting input coupled to the first input terminal, a non-inverting input coupled to an output of the first low-pass filter and an output coupled to the first input terminal via the first resistor;

a second capacitor coupled between the second input terminal and the second output terminal;

a second low-pass filter coupled to the second output terminal; and a second operational amplifier having an inverting input coupled to the second input terminal, a non-inverting input coupled to an output of the second low-pass filter and an output coupled to the second input terminal via the second resistor; and a variable capacitance stage including:

a first variable capacitor coupled between the voltage supply and the first input terminal; and a second variable capacitor coupled between the voltage supply and the second input terminal.

10. The device of claim 9, wherein the first variable capacitor varies according to $$C_0 + \frac{\Omega \cdot \sin(\omega_d)}{2}$$

and the second variable capacitor varies according to $$C_0 - \frac{\Omega \cdot \sin(\omega_d)}{2},$$

where $C_0$ is a constant capacitor, $\Omega$ is an angular velocity associated with the first variable capacitor and the second variable capacitor and $\omega_d$ is a drive oscillation frequency.

11. The device of claim 9, wherein the first operational amplifier is configured to output a first voltage signal to compensate for a first current leakage at the first input terminal and the second operational amplifier is configured to output a second voltage signal to compensate for a second current leakage at the second input terminal.

12. The device of claim 9, wherein the differential amplifier is configured to receive a first input signal at the first input terminal and a second input signal at the second input terminal and output a first output signal at the first output terminal and a second output signal at the second output terminal.

13. The device of claim 12, wherein a difference between a voltage of the second output signal and a voltage of the first output signal is proportional to a difference between a voltage of the first input signal and a voltage of the second input signal.

14. The device of claim 12, wherein the first low-pass filter is configured to receive the first output signal and output a first filtered signal that is a direct current (DC) component of the first output signal.

15. The device of claim 14, wherein the first operational amplifier is configured to receive the first input signal at the inverting input and the first filtered signal at the non-inverting input and output a first compensation signal that compensates for a first current leakage in the first input signal.

16. The device of claim 12, wherein the second low-pass filter is configured to receive the second output signal and output a second filtered signal that is a direct current (DC) component of the second output signal.

17. The device of claim 16, wherein the second operational amplifier is configured to receive the second input signal at the inverting input and the second filtered signal at the non-inverting input and output a second compensation signal that compensates for a second current leakage affecting the second input signal.

18. A method, comprising:

receiving, by a differential amplifier, a first input signal and a second input signal;

outputting, by the differential amplifier, a first output signal and a second output signal;

filtering the first output signal to obtain a first filtered signal;

comparing the first filtered signal to the first input signal;

outputting a first compensation signal having a first voltage that is a function of a difference between a voltage of the first filtered signal and a voltage of the first input signal; and compensating current leakage in the first input signal using the first compensation signal.

19. The method of claim 18, further comprising:

filtering the second output signal to obtain a second filtered signal;

comparing the second filtered signal to the second input signal;

outputting a second compensation signal having a second voltage that is a function of a difference between a voltage of the second filtered signal and a voltage of the second input signal; and compensating current leakage in the second input signal using the second compensation signal.

20. The method of claim 18 wherein the first filtered signal is a DC component of the first output signal.

* * * * *